United States Patent [19]

Ikeya

[11] Patent Number: 5,407,361
[45] Date of Patent: Apr. 18, 1995

[54] SOCKET

[75] Inventor: Kiyokazu Ikeya, Shizuoka, Japan

[73] Assignee: Texas Instruments Incorporated, Dallas, Tex.

[21] Appl. No.: 114,570

[22] Filed: Aug. 31, 1993

[30] Foreign Application Priority Data

Sep. 24, 1992 [JP] Japan .................. 4-279436

[51] Int. Cl.⁶ .............................................. H01R 9/09
[52] U.S. Cl. ........................................ 439/72; 439/331
[58] Field of Search ............... 439/68, 70, 71, 72, 439/73, 77, 330, 331, 525, 526

[56] References Cited

U.S. PATENT DOCUMENTS

| 4,623,208 | 11/1986 | Kerul et al. |
| 4,678,255 | 7/1987 | Carter |
| 4,715,823 | 12/1987 | Ezura et al. |
| 4,846,704 | 7/1989 | Ikeya |
| 5,076,798 | 12/1991 | Uratsuji |
| 5,108,302 | 4/1992 | Pfaff |
| 5,199,883 | 4/1993 | Uratsuji .................. 439/72 |
| 5,249,972 | 10/1993 | Walker .................... 439/72 |
| 5,266,037 | 11/1993 | Hetzel et al. ........... 439/331 X |
| 5,276,961 | 1/1994 | Matta et al. ............ 439/72 X |

FOREIGN PATENT DOCUMENTS 4-004580 1/1992 Japan .................. 439/331

Primary Examiner—Khiem Nguyen
Attorney, Agent, or Firm—Russell E. Baumann; Richard L. Donaldson; Renee E. Grossman

[57] ABSTRACT

A socket for mounting an electrical part 30 in a freely detachable manner in which the electrical part 30 has a plurality of terminal leads 30a of a prescribed pitch P between the leads 30a has socket terminals 52 fixed in the socket and flexible electroconductive parts 38 corresponding to the pitch of the terminal leads on an insulating substrate 40 for making electrical contact with the terminal leads 30a of the electrical part 30 and the fixed socket terminals 52.

11 Claims, 5 Drawing Sheets

SOCKET

BACKGROUND OF THE INVENTION

This invention relates to sockets for the mounting of electrical parts such as an IC package and obtaining an electrical connection with the electrical parts.

In the production of semiconductor parts, it is generally the case that the IC package prepared by resin sealing semiconductor integrated circuit chips (IC chips) are subjected to a reliability test called "burn-in" prior to their shipment. This "burn-in test is a functional test subjecting the chip to a temperature and voltage condition for the purpose of separating the good product from the bad product.

The construction of a conventional socket which has been used for such IC package mounting in the burn-in test is shown in FIGS. 8 through 11. FIG. 8 shows the plane view and FIG. 9 shows the side view of this conventional socket and FIGS. 10 and 11 are expanded partial cross-section views.

As shown in FIG. 9, this socket comprises a base 100 as the main socket body to be mounted on a substrate (which is not shown in the drawing) and a cover 102 which is mounted in a freely reciprocating manner with respect to this base 100. As shown in FIG. 8, a square opening 106 is provided on the cover 102 for taking out and inserting IC package 104 (reference should be made to FIGS. 10 and 11) in the main socket body. When the cover 102 moves vertically in relation to the base 100, the angular parts 106a at the four corners of this opening 106 are guided by the two sides 108a outside of four guides 108 that are erected on the base 100.

The upper surface of the base 100 as shown in these figures is constructed to mount an IC package 104 of the QFP (Quad-in-line Flat Package) type. Two sides 108b inside each of the guides 108 constitute an inclined surface, with a tapered groove 108c which expands downward forming an angular part. A corresponding angular part of IC package 104 is to be guided by these grooves 108c upon mounting and removing IC package 104 from the socket. In addition, an L-shaped rib 110 is provided close to the base of each groove 108 on the base 100. The IC package 104 is positioned on the upper surface of the base by these ribs 110. On the base 100, a plurality of contacts 112 corresponding to the row of lead terminals on each side of the IC package 104 are provided in a row.

The construction and action of each of the contacts 112 will be explained below by referring to FIGS. 10 and 11. The contacts 112 may be prepared by blanking them out of a thin sheet of an electrically conductive material such as beryllium copper or the like. The contacts comprise a base part 112a which is buried in the base 100, an arc spring part 112b that extends in a curved manner upward from the upper end of this base part 112a, a lever part 112c that extends upward in a generally straight line from the upper edge of this arc spring part 112b, a lead holding part 112d that extends horizontally from the upper edge of the arc spring part 112b toward the center of the socket and a hook-shaped contact 112e which is formed at the tip of this lead holding part 112d. Additionally, a socket terminal pin 112f of the contacts protrudes vertically downward from the lower end of the base end 112a.

Lever part 112c has a tip portion 112g which is constantly in contact with an inclined sliding surface 114a of a cam part 114 which is provided in a protuberant manner from the lower surface of the cover 102. At the time when the cover 102 makes a vertical movement as compared with the base 100, the tip 112g of the lever part 112c follows the inclined sliding surface 114a of the cam part 114, with a consequence that the lever part 112c moves changing its position. On the inclined sliding surface 114a, there is provided partition walls 114b which guide both of the sides of the lever 112c so as to prevent the neighboring contacts 112 from contacting each other. On base 100 there is provided a lead mounting surface 116. On lead mounting surface 116 of the base 100, there is also erected a set of partition walls 118 so that the contact part of each contact 112 will not touch the neighboring contact 112.

The operation and action of the socket at the time when an IC package is mounted will be explained below.

In a state when the IC package 104 is not mounted, the cover 102 is pushed down from the position shown in FIG. 10 to the position shown in FIG. 11. As a result of this downward movement of the cover the lever part 112c which slidingly contacts the inclined sliding surface 114a of the cover changes its position in a generally clockwise direction. Along with this lever part 112c, the arc spring 112b also changes it position, with a result that the arc is compressed and that the upper edge of the arc spring 112b or the lower edge of the lever part 112c moves downward.

Likewise, the contact part 112e at the tip of the lead holding part 112d changes its position moving in a clockwise direction.

In this state, contact part 112e of the contact 112 is rotated upward from the lead mounted surface 116 so that the IC package 104 can be inserted into the main socket through an opening 106 from above the cover 102. At this juncture, the IC package 104 is guided to the base 100 by the groove 108c on the inside angular part of the guide 108 and positioned on the base 100 by the rib 110. Upon insertion, the bent tip of each lead 104a of the IC package 104 is placed on the lead mounting surface 116 at a prescribed location on the side of the base 100.

FIG. 11 shows the state in which the IC package has been inserted into the main socket in this manner.

Next, the downward force of the cover 102 is released. Thereupon, the cover 102 rises to its original position due to recovering force of the arc spring part 112b of the contact 112. The contact 112 is restored approximately to the original shape with the tip contact part 112e of the lead holding part 112d compressively engaging the bent tip part of the lead 104a of the IC package 104, thereby establishing contact with the bent tip part.

FIG. 10 shows the state in which an electric connection has been established in this manner between the IC package 104 and the contact members of the main socket.

In order to remove the IC package 104 from the main socket, the cover 102 is once again pushed toward the base 100 and the tip contact part 112e of the contact 112 is lifted from engagement with the lead 104a of the IC package 104 with a result that the IC package 104 can be removed from the socket.

In the prior art socket, the contact 112 is moved from the original position in connection with the forward movement of the cover 102, thereby making it possible for the IC package 104 to be charged into or extracted from the base 102. Upon restoring the contact 112 to its original position in connection with the return movement of the cover 102, the contacting of the contact 112 with the lead 104a of the IC package 104 is obtained. In order to prevent each of the plurality contacts 112 from touching the neighboring contact 112, partition walls 118 and 114b are provided at an interval corresponding to the pitch of the leads 104a on the inclined sliding surface 114a of the cover 102 as well as the lead mounted surface 116 of the base 100.

With an increase in the degree of integration of the IC chips, the number of leads (pins) of the IC package have increased and thus the pitch between the leads has become narrower (smaller). This results in the partition walls 118 and 114b needing to be thinner and thinner. For example, for an IC package wherein the width of the lead 104a is 0.15 mm and the pitch between the leads is 0.3 mm, the gap between the contacts is approximately 0.15 mm with the partition walls 118 and 114b having to be formed in this gap. Since each contact 112 changes its position, a certain amount of clearance is also required. Thus, it becomes necessary to maintain the thickness of the partition walls 118 and 114b to less than approximately 0.11 mm. It is difficult to make these sockets with an ever decreasing thickness of the partition walls.

SUMMARY OF THE INVENTION

Accordingly, a purpose of this invention lies in offering a socket which is capable of easily coping with an increased number of pins and a narrowed pitch of the electrical parts.

The socket according to this invention is used for mounting an electrical part in a freely detachable manner in which the electrical parts has a body portion with a plurality of connective terminal leads extending from the body portion with a prescribed pitch between the leads. The socket comprises a main body, a socket terminal means fixed in the socket body, and a plurality of electroconductive parts on an insulated substrate contained in the socket body with the electroconductive parts having a pitch corresponding to the pitch of the plurality of connective terminal leads, said electroconductive parts having first and second contacts means, the first contact means for electrically connecting with connective terminal leads of the electrical part and the second contact means for electrically connecting with the socket terminal means, thereby providing electrical contact between the electrical part and the socket.

Further, in accordance to a socket of this invention, an elastic support is provided for elastically supporting the electroconductive parts on the insulated substrate so that if the connective terminal part of a prescribed electrical part is placed on the electroconductive part and a compressive force is applied from the top, the elastic support part undergoes an elastic deformation as does electroconductive part and the insulated substrate. This action assures that a suitable electric contact pressure is obtained between the contact terminal lead of the electric part and the electroconductive part. Since the socket terminal part is connected with the second contact part of the electroconductive part, the connective terminal lead of the electric part will be connected electrically with the socket terminal part that corresponds thereto through the electroconductive part.

DESCRIPTION OF THE DRAWINGS

Other objects, advantages and details of this invention appear in the following detailed description of the preferred embodiments of the invention, the detailed description referring to the drawings in which.

DETAILED DESCRIPTION OF THE PREFERRED EMBODIMENTS

The invention will be explained below by referring to FIGS. 1 through 7.

Figure 1:
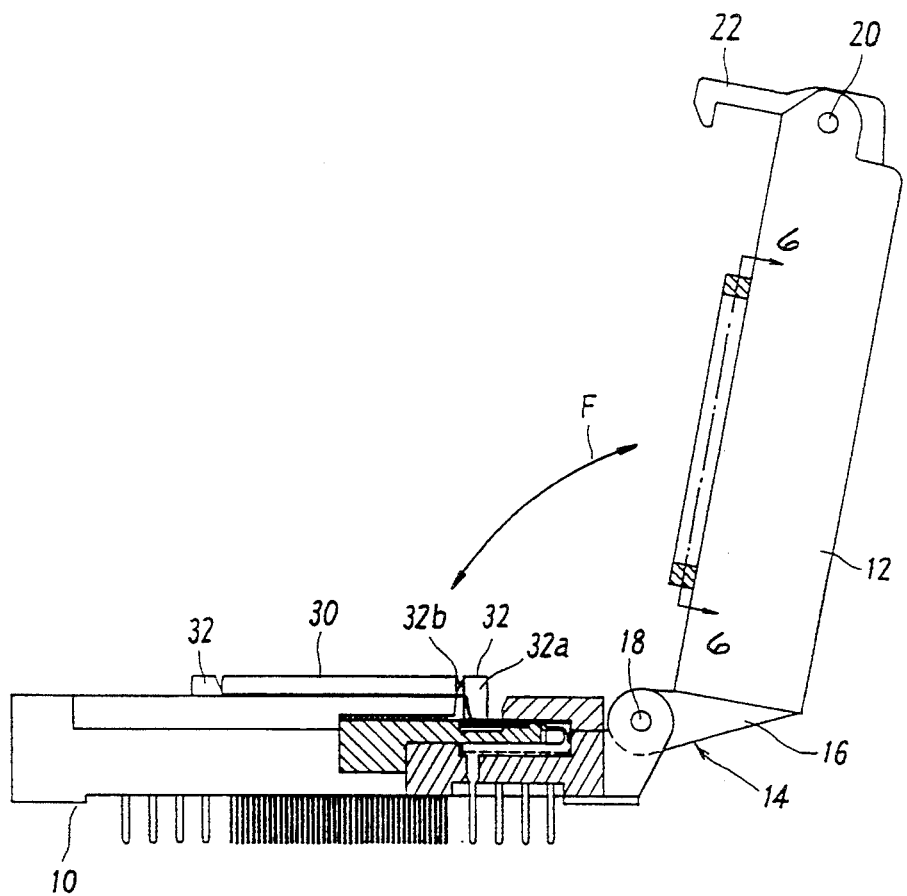
Fig. 1 is a partial cross-sectional side view of the socket of the present invention in which the cover of the socket is in the open position.
Figure 2:
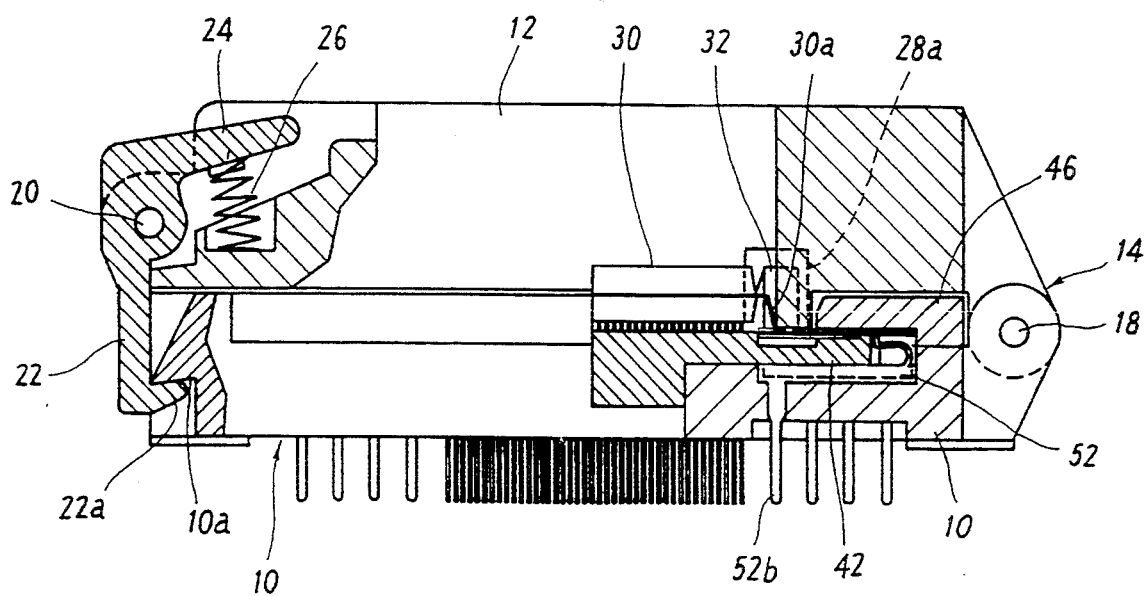
FIG. 2 is a partial cross sectional side view of the socket of the present invention in which the cover of the socket is in the closed position.
Figure 3:
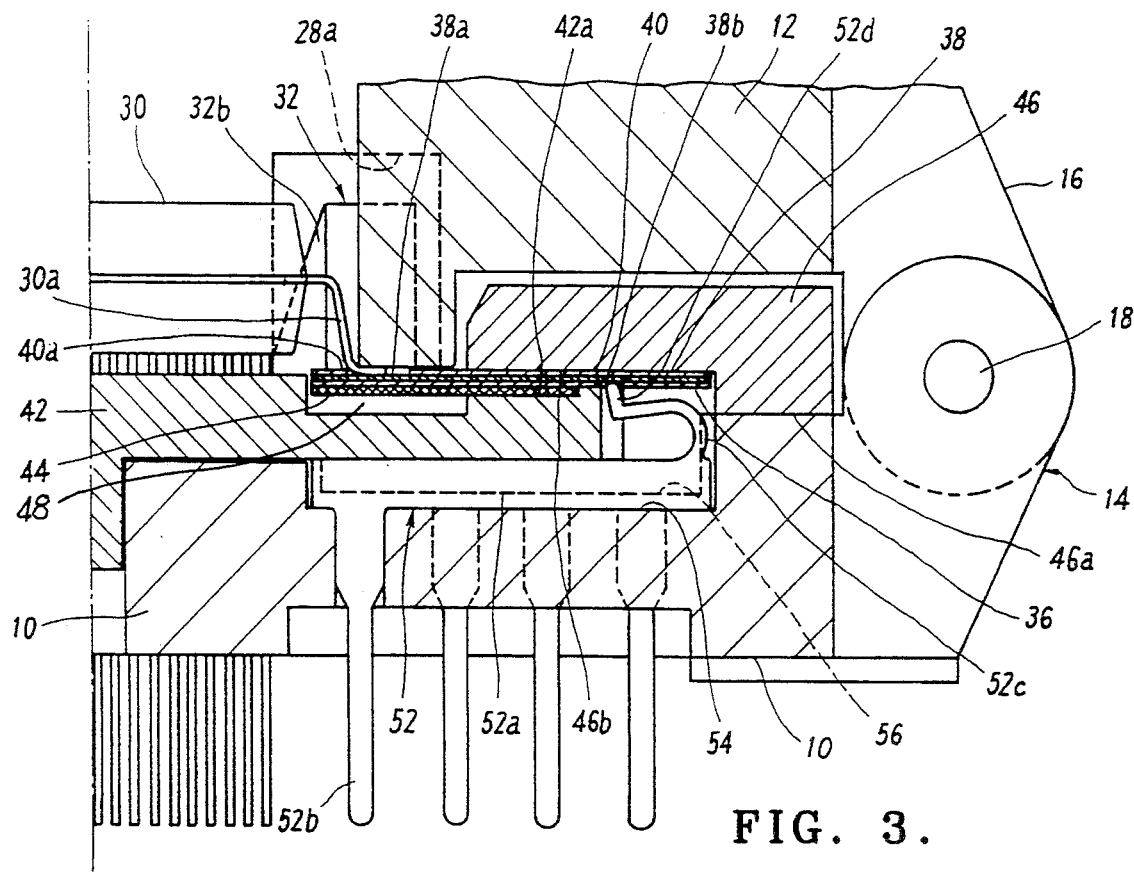
FIG. 3 is an enlarged partial cross-sectional view of the contacting position of the socket of the present invention.

FIGS. 1 and 2 are the partial cross-sectional side views of the entire construction of a socket in accordance with this invention. FIG. 3 is an expanded partial cross-section of the construction of the essential part of this socket.

The socket comprises a base 10 as the main socket body to be typically fixed on a printed circuit substrate (which is not shown in the drawings) and a cover 12 that has been installed to be opened or closed with a hinge 14 at one side of the socket for holding the base and cover together. Movable sheet pieces 16 of this hinge 14 are formed on a side of the cover 12 and the cover 12 is made rotatable in the direction which is indicated by an arrow mark F, with the rotary shaft 18 of the hinge 14 as the center.

A latch 22 is installed on a rotary shaft 20. This latch provides for the holding of the cover 12 in engagement with base 10. When latched as is shown in FIG. 2, the cover 12 is closed against the upper surface of the base 10 as a hook part 22a of this latch 22 is engaged with the concave part 10a that is provided on the opposing side of the base 10.

A lever 24 extends in a direction which is opposite to the latch 22 shown as formed integrally with the latch 22. As this lever 24 is rotated in a clockwise direction (as shown in FIG. 2) against the force of a compressive coil spring 26, the latch 22 is disengaged from the concave part 10a of the base 10 and the cover 12 is opened.

The upper surface of the base 10 is so formed as to be able to mount an IC package 30 of the QFP type. On the upper surface of the base 10, four guides 32 are erected in close proximity to the four corners of the mounting position of the IC package 30. Two sides 32a inside each of the guides 32 constitute an inclined surface, at the angular part thereof, a tapered groove 32b which expands toward the base edge is formed. The angular part of the IC package 30 is guided by these grooves 32b.

Figure 4:
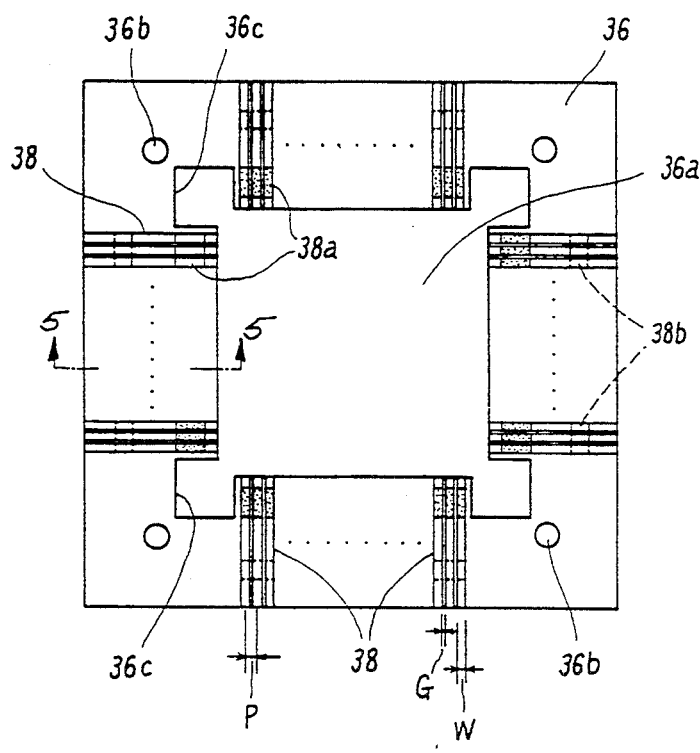
FIG. 4 is a plane view of the arrangement pattern of electroconductive parts of the socket according to the present invention.

In the base 10, a plurality of electroconductive parts 38 corresponding preferably one to one to the lead terminal row of each side of the IC package 30 are arranged on an insulated film 36 such as one made of polyamide, for example, in a pattern which is clearly shown in FIG. 4, between the two neighboring guides 32.

As shown in FIG. 4, insulated film 36 is formed in the shape of a square frame and an approximately rectangular central opening 36a demarks a position for the mounting of the IC package 30. On the four sides of this insulated film 36, a row of strip-shaped electroconductive films (parts) 38, whose width is W and with a pitch P corresponding to the lead terminal pitch of the IC package 30. The parts are arranged in such a manner as to surround the IC package mounting position. In the case where the lead terminal pitch of the IC package 30 is 0.3 mm and the lead width is 0.15 mm, the pitch P of electroconductive film 38 can be selected at 0.3 mm, the width W of the electroconductive film 38 at 0.20 mm and the gap G between the neighboring electroconductive films 38 at 0.10 mm.

Figure 5:
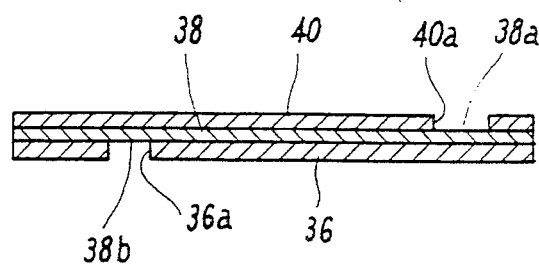
FIG. 5 is a cross-sectional view cut along line 5—5 of FIG. 4.

As is shown in FIG. 5, an insulating film 40 made of for example of polyamide, is placed on these electroconductive films/parts 38. At various places or at those locations where contact is made by the various lead terminals, this insulating film 40 is cut and, at such a cut part 40a, the electroconductive film 38 is exposed. The exposed part of said electroconductive film 38 forms a first contact 38a. On the reverse side of the electroconductive film 38, the insulating film 36 is cut at a location which is the back as viewed from the side of the IC package mounting position (on the side of the opening 36a), with the electroconductive film 38 being exposed at such a cut part 36a. The electroconductive film 38 may be for example a copper layer plated with gold or it may be formed on the insulating film 36 by other means as are known in the art.

Further, as shown in FIG. 4, holes 36b (positioning holes) are provided in the neighborhood of the four corners of the insulating film 36 for positioning the insulating film 36 on the base 10. At each of the angular parts of the inside part of the insulating film 36 a rectangular cut part 36c is formed for the purpose of passing each guide 32 that is erected on the base 10.

With reference to FIG. 3, a lower holding plate 42 is arranged at the center of the upper surface of the base 10. At the outer peripheral part of the upper surface 42a of this lower holding plate 42, a spring 44 made for example of beryllium copper is installed and a three-layer sheet, comprising the aforementioned insulating film 36, electroconductive film 38 and the insulating film 40 is arranged on top of this sheet spring 44.

In the upper outer peripheral part of the base 10 an upper holding sheet member is provided with a lower surface outside portion 46a and a lower surface inside portion 46b. The lower surface inside portion 46b of this upper holding plate 46 is positioned in relation to the upper peripheral part 42a of the lower holding sheet 42 in such a way as to sandwich the sheet spring 44, the insulating film 40, electroconductive film 38 and the insulating film 36 between them.

In addition, there is provided a recess or concave part 48 in the upper peripheral part 42a of the lower holding plate 42. Extending above this concave part 48, a flexible part 50 of a four-layer sheet comprising sheet spring 44, insulating film 36, electroconductive film 38 and insulating film 40 is provided. This movable part 50 is made to be adapted to move with regard to that part of the four layer sheet which has been sandwiched and fixed between upper peripheral edge 42a of the lower holding sheet 42 and the lower outer side 46a of the upper holding plate 46. That is, the four layer sheet is cantilever mounted with the flexible part 50 extending therefrom.

In accordance with this invention, a slit may be provided on the sheet spring 44 at a pitch corresponding to the pitch of the electroconductive film 38.

A prescribed number of socket terminals 52 typically corresponding to the lead terminals of the IC package 30 are provided on the base 10. At the position of the upper surface of the base 10 corresponding to the electroconductive film 38 on the insulating film 36 that is arranged around the IC package mounting position as described above, a prescribed number of grooves 54 are formed at a pitch corresponding to the pitch of the electroconductive film 38, with one socket terminal 52 being inserted and installed in each groove 54.

A partition wall 56 is provided between the neighboring grooves 54.

In the case where the pitch P of the electroconductive film 38 is selected at 0.3 mm, the width W of the electroconductive film 38 at 0.20 mm and the gap G between the electroconductive films 38 at 0.10 mm conveniently, the width of the groove 54 or the thickness of the socket terminal 52 may be at 0.2 mm with the thickness of the partition wall 56 at 0.1 mm.

Since, in this case, it is possible to make the height of the partition wall 56 sufficiently small as compared with the conventional technology, its thickness, too, can be made 0.1 mm.

Moreover, an insulating film of 0.1 mm may be caused to exist in the place of the partition wall 56. It is also possible to cause the shape of the insulating film to agree with the shape of the contact, with pasting being carried out by using an adhesive.

The socket terminal 52 has a base part 52a which is inserted into the groove 54 of the base 10, a terminal pin part 52b which extends vertically downward from the inner terminal of this base part 52a, an arc spring part 52c which extends upward in a curved manner toward the upper edge of the outer side of the lower holding sheet 42 from the outside terminal of the base edge 52a and a contact 52d which has been formed at the tip of this arc spring part 52c.

The contact part 52 of the socket terminal is in compressive contact with the second contact 38b of the electroconductive film 38 which is exposed from the cut part 36 of the insulating film 36 at all times with an elastic force due to the deformation of the arc spring part 52c. In view of the fact that the electroconductive film 38 side is held against the lower surface of the upper holding sheet 46, the sheet 46 provides a positive stop to control movement of the contact part 52d of the socket terminal 52. In this manner each socket terminal 52 electrically contacts the respective second contact of the electroconductive film 38 in a 1:1 relationship.

Figure 6:
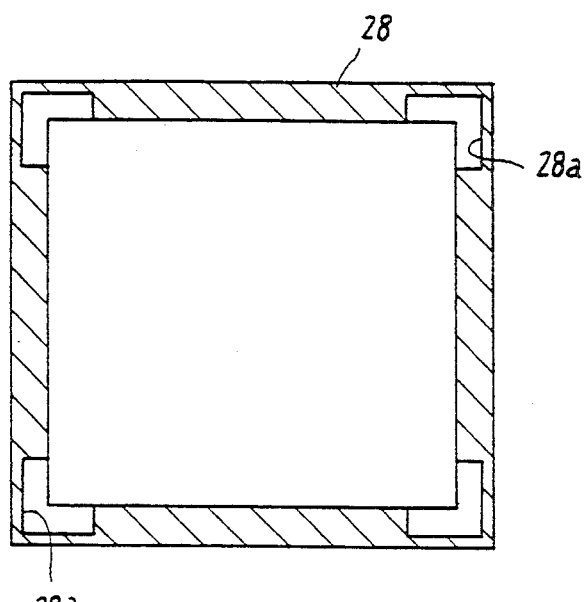
FIG. 6 is a cross-sectional view cut along line 6—6 of FIG. 1.

As shown in FIG. 6, a holding pad 28 for compressing the lead terminal 30a of the IC package 30 is provided on the inner surface of the cover 12. Since the IC package 30 is of the QFP type and since it has terminal leads that protrude in four directions, holding pad 28 is shaped in a generally rectangular shape with a large central opening as is shown in FIG. 6. At the inner angular part of this holding pad 28, a cut part 28a for avoiding the guide 32a of the base is provided.

Below, the operation of the socket when the IC package 30 is to be mounted on the main socket body will be explained.

Figure 7:
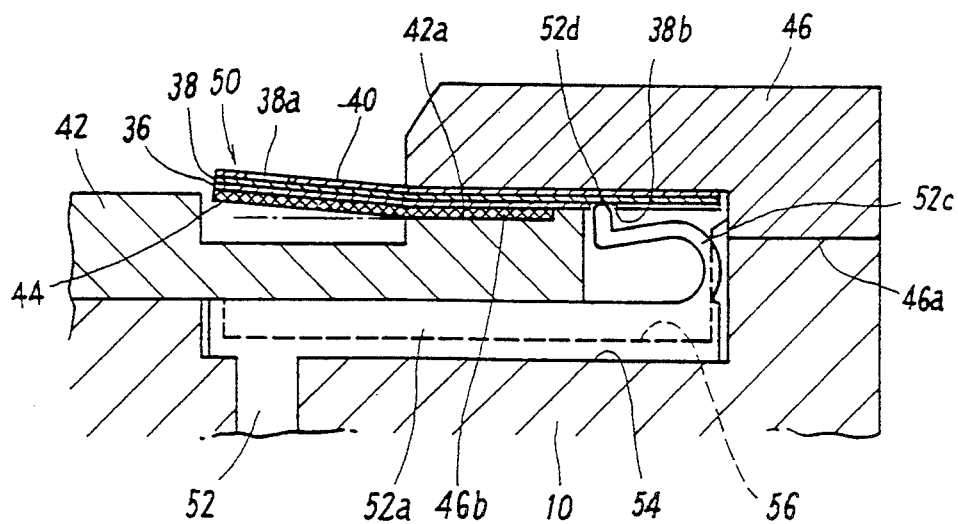
FIG. 7 is an expanded partial cross-section of the socket contacting means where no electrical part has been inserted.
Figure 8:
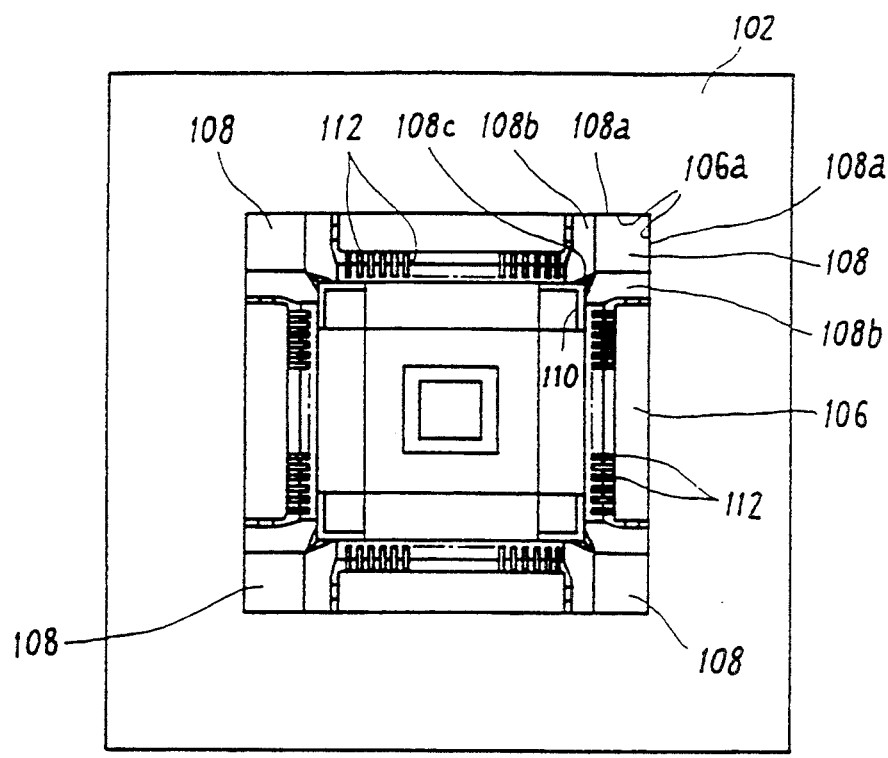
FIG. 8 is a plane view showing the construction of a prior art socket.
Figure 9:
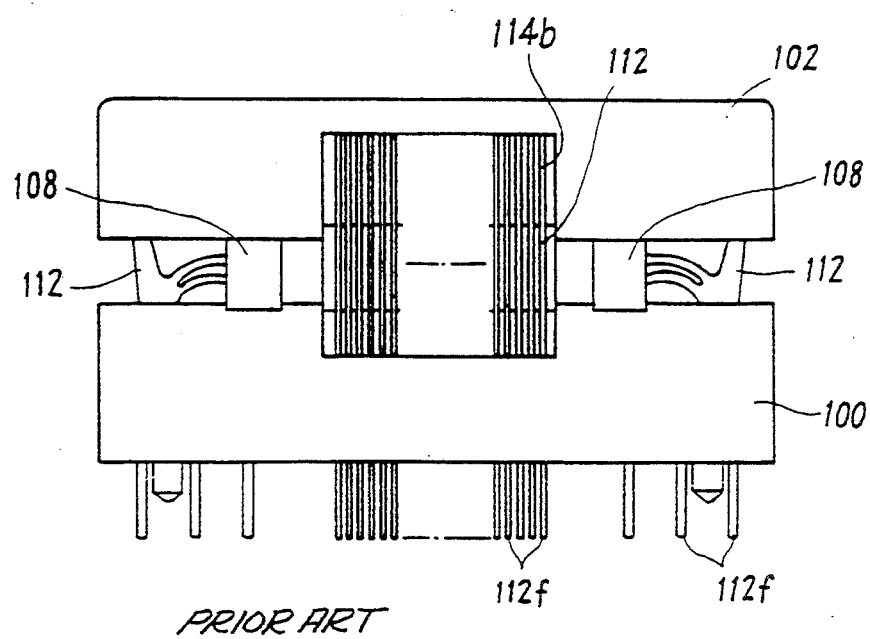
FIG. 9 is a side view of the socket of FIG. 8.
Figure 10:
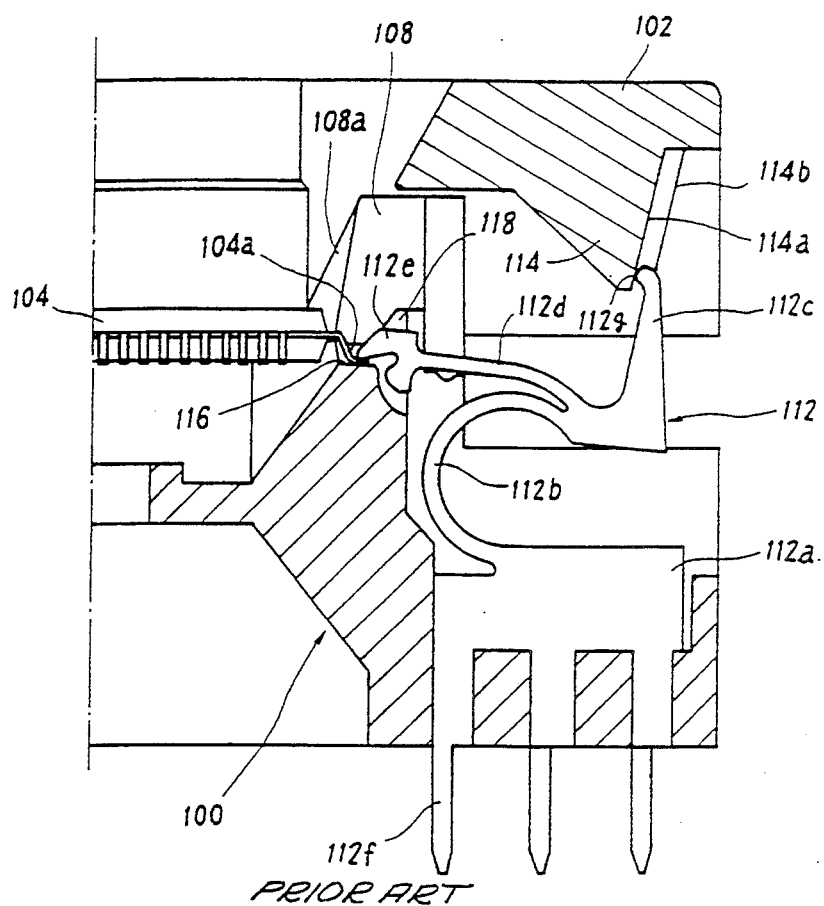
FIG. 10 is an expanded partial cross-sectional view of an essential part of the prior art socket.
Figure 11:
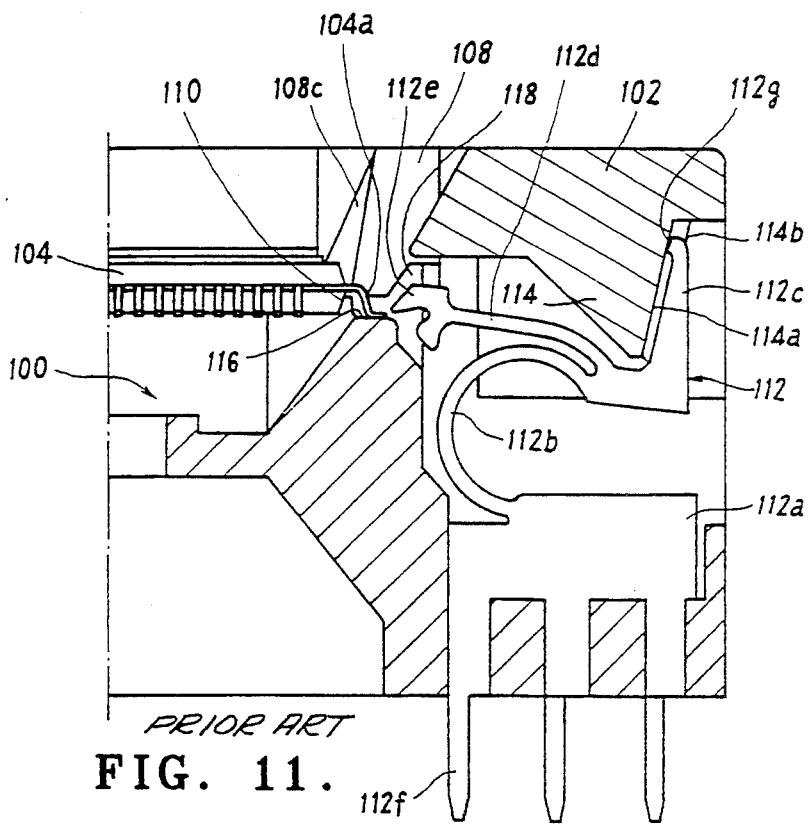
FIG. 11 is another expanded partial cross-sectional view of an essential part of the prior art socket.

Prior to the mounting of the IC package, the flexible part 50 of the four layer sheet comprising a sheet spring 44, an insulating film 36, an electroconductive film 38 and an insulating film 40 is tilted upward as is shown in FIG. 7.

When the cover 12 is opened and the IC package 30 is charged into the IC package mounting position of the base 10 as is shown in FIG. 1, the IC package 30 is guided by the inner angular part 32b of the guide 32 and the curved tip part of each lead terminal 30a is placed on the first contact 38a of the electroconductive film 38 corresponding thereto. That is, each lead terminal 30a is placed on a contact 38a.

Since the first contact part 38a is surrounded by the cut part of the insulating film 40, the curved tip part of the lead terminal 30a is positioned inside this cut part.

When the cover 12 is closed and the latch 22 is tightened as shown in FIG. 2, the holding pad 28 of the cover 12 covers the lead terminal rows of the IC package 30, thereby pressing down the various lead terminals 30a. By the compression from this holding pad 28, the flexible part 50 of the four layer sheet bends down until it assumes approximately a horizontal state as is shown in FIG. 3. A suitable electric contact is achieved between the various lead terminals 30a and the first contact 38a of each electroconductive film 38 because of the elastic force of the sheet spring 44 due to this bending.

Additionally, the second contact 38b of each electroconductive film 38 is contacted by the contact part 52d of each socket terminal 52. Accordingly, each lead terminal 30a is electrically connected to each socket terminal 52 through each electroconductive film 38. In this manner, the IC package 30 is mounted in the socket and can receive a prescribed test such as the burn-in test.

In order for the IC package 30 to be taken out of the main socket, the latch 22 is disengaged and the cover 12 is opened, thereby bringing about a state which is shown in FIG. 1. Thus, it is only necessary to pick out the IC package 30 by a pair of tweezers.

According to the socket described in this example, an electric connection is obtained between the lead terminal 30a and the socket terminal 52 by placing the lead terminal 30a of the IC package 30 on the electroconductive film 38 arranged to make contact with the lead terminals generally outwardly adjacent the IC package body mounting position and then closing the cover 12 on the base and pressing them together. The socket terminals 52 do not move their position during mounting or removing the IC package.

The electroconductive film 38 that is contacted by the lead terminal 30a at the first contact point 38a is pattern-formed by putting the electroconductive film on the insulating film 36 and it is made to change its position downward integrally with the insulating film 36 and sheet spring 44 in such a way as to receive the lead terminal 30a and insure reliable contacting.

The electroconductive film 38 which is constructed in this manner can make its pitch P, width W, and gap G (see FIG. 4) as small as possible in conformity with an increase in the number of pins and a narrowing of the pitch of the IC package 30.

The socket terminal 52 that is in contact with the second contact part 38b of the electroconductive film 38 does not change its position as it is fixed to the base 10. Therefore, it can be made thin. Moreover, it does not need any clearance. Even if the pitch of the socket terminal 52 may be narrowed, a sufficient margin can be provided in the thickness of the partition wall 56.

In the above described embodiment, the insulating film 40 is put on the electroconductive film 38 and the lead terminal 30a is placed inside the cut part 40a of the insulating film 40 where the first contact 38 is positioned, thereby preventing any positional shift of the lead terminal. In the case where some other suitable positioning means is employed, however, the insulating film 40 may be omitted. Further, a sheet spring 44 was employed as a means for elastically supporting the insulating film 36. However, it is possible to employ other such elastic support means such as rubber.

In addition, the connection of the socket terminal with the second contact of the electroconductive film can be made of the fixed contact type such as by soldering, etc. in the place of the present described pressure contact method.

Still further, the socket was described for use in the IC package of the QFP type having a lead that has been bent in the shape of a gull-wing. However, this invention can also be used for the IC package, etc. having a straight lead prior to being bent in the shape of a gull wing. Moveover, the socket can be used for electric parts other than the IC package.

Lastly, the socket according to this invention can be used not only in the burn-in or functional tests but also in any use where the electrical parts are made freely detachable and attachable.

Accordingly the socket of this invention has an insulating substrate contained therein that is supported by an elastic support adjacent the mounting position of the body portion of an electrical part with connective terminals to be mounted on the socket. An electroconductive means is provided on the insulating substrate at a pitch corresponding to the pitch of the connective terminal parts of the electrical part so that contact is made between the connective terminals and first contact parts of the electroconductive means. The socket terminal part is connected to second contact parts of the electroconductive means, thereby achieving an electric connection between the connective terminals of the electrical part and the socket terminals through such an electroconductive means so that an increased number of terminals and a narrowed pitch of the connective terminals can be accommodated.

This invention has been described above with reference to specific embodiments; however, it is intended to embrace all such alternative, modifications and variations as fall within the spirit and scope of the appended claims.

I claim:

1. A socket for mounting an electrical part in a freely detachable manner in which the electrical part has a body portion with a plurality of connective terminal leads extending from the body portion with a prescribed narrow pitch between the leads comprising a main socket body for receiving the electrical part, a socket terminal means fixed in the socket body, and a plurality of electroconductive parts on one surface of an insulated substrate flexibly mounted in the socket body with the plurality of electroconductive parts having a pitch between parts corresponding to the pitch between the connective terminal leads, each of the electroconductive parts having first and second contact means, said insulating substrate containing a plurality of cut out areas defining the second contact means of the electroconductive parts, the first contact means for electrically connecting with one of the connective terminal leads of the electrical part and the second contact means for electrically connecting with the socket terminal means thereby providing electrical connection between the electrical part and the socket.

2. A socket according to claim 1 further including a cover attached to said socket body movable between an open and a closed position with respect to said socket body wherein said cover holds the plurality of connective terminal leads in contact with the first contact means of the plurality of electroconductive parts when in the closed position.

3. The socket according to claim 2 wherein said cover further includes a hold pad contained in the cover and positioned to come into contact with the plurality of connective terminal leads when in the closed position thereby compressing said leads in contact with the first contact means of the plurality of the electroconductive parts.

4. The socket according to claim 1 wherein said socket terminal means is stationary during mounting and dismounting of the electrical part.

5. The socket according to claim 4 wherein said socket terminal means comprises a plurality socket terminal parts of the same pitch as the pitch between the plurality of connective terminal leads so as to provide one terminal part in the socket for every one connective terminal lead.

6. The socket according to claim 5 wherein the pitch and the number of said connective terminal leads of the electrical parts, said electroconductive parts and said terminal parts are identical and one lead makes contact with only one electroconductive part which makes contact with one terminal part.

7. The socket according to claim 1 further including an insulating means generally covering the plurality of the electroconductive parts on a surface opposite the one surface in contact with the insulating substrate and containing a plurality of cut-out areas defining the first contact means of the electroconductive parts.

8. The socket according to claim 7 further including a spring means mounted in combination with said insulating means, said electroconductive parts and said insulating substrate in the socket.

9. The socket according to claim 8 wherein the said combination of said spring means, said insulating means, said electroconductive parts and said insulating substrate are mounted in the socket at one end with an opposite end allowed to move freely along one axis.

10. The socket according to claim 9 wherein said socket contains a recess adjacent the body portion of the electrical part and generally positioned in line with the plurality of connective terminal leads for allowing said free movement of the opposite end of the combination of said spring means, said insulating means, said electroconductive parts and said insulating substrate from the one end of the combination mounted in the socket.

11. A socket for mounting an electrical part in a freely detachable manner in which the electrical part has a body portion with a plurality of connective terminal leads extending from the body portion with a prescribed narrow pitch between the leads comprising a main socket body for receiving the electrical part, a socket terminal means fixed in the socket body which is stationary during mounting and dismounting of the electrical part, and a plurality of electroconductive parts on one surface of an insulated substrate with an insulating means generally covering the plurality of electroconductive parts on the surface opposite the surface in contact with the insulating substrate flexibly mounted in the socket body in which the plurality of electroconductive parts have a pitch between parts corresponding to the pitch between the connective terminal leads, each of the electroconductive parts having first and second contact means, said insulating substrate containing a plurality of cut out areas defining the second contact means for the electroconductive parts, the first contact means for electrically connecting with one of the connective terminal leads of the electrical part and the second contact means for electrically connecting with the socket terminal means thereby providing electrical connection between the electrical part and the socket.

* * * * *